United States Patent [19]

Takahashi et al.

[11] Patent Number: 5,316,894
[45] Date of Patent: May 31, 1994

[54] METHOD OF MAKING PRINTED WIRING BOARDS

[75] Inventors: Hisaya Takahashi; Toshihide Itoh, both of Toyama, Japan

[73] Assignee: NEC Corporation, Japan

[21] Appl. No.: 885,268

[22] Filed: May 18, 1992

[30] Foreign Application Priority Data

May 27, 1991 [JP] Japan .................................... 120569

[51] Int. Cl.$^5$ .............................................. G03F 7/26
[52] U.S. Cl. ........................................ 430/313; 427/96; 430/311; 430/317; 430/327; 430/329; 430/330
[58] Field of Search ............... 430/280, 286, 287, 281, 430/288, 271, 313, 325, 330, 314, 315, 311, 316, 317, 318, 327; 427/96

[56] References Cited

U.S. PATENT DOCUMENTS 4,943,516  7/1990  Kamayaehi et al. ................ 430/280
5,134,056  7/1992  Schmidt et al. ..................... 430/313

Primary Examiner—Nathan M. Nutter
Assistant Examiner—Shelley A. Dodson
Attorney, Agent, or Firm—Laff, Whitesel, Conte & Saret

[57] ABSTRACT

A method of making a printed wiring board comprises the steps of applying a solder resist onto a printed wiring board on which circuits for junction and pads for surface-mounting are formed, to form a solder resist layer; grinding the surface of the solder resist layer to remove the solder resist present on the circuits and the pads and to expose the surface thereof; applying a light-sensitive liquid solder resist to the surface of the printed wiring board, drying the light-sensitive solder resist layer to form a light-sensitive solder resist film; exposing the light-sensitive solder resist film to light through a mask film carrying a desired pattern; and then dissolving the un-exposed area of the light-sensitive solder resisit film with a developer to remove the same area and to cover the exposed area with the cured solder resist film. The method does not suffer any discrepancy of position of a solder resist film relative to the distributing wire and pad patterns formed on the printed wiring board and peeling off of the solder resist film and the method can ensure high reliability of soldering.

13 Claims, 4 Drawing Sheets

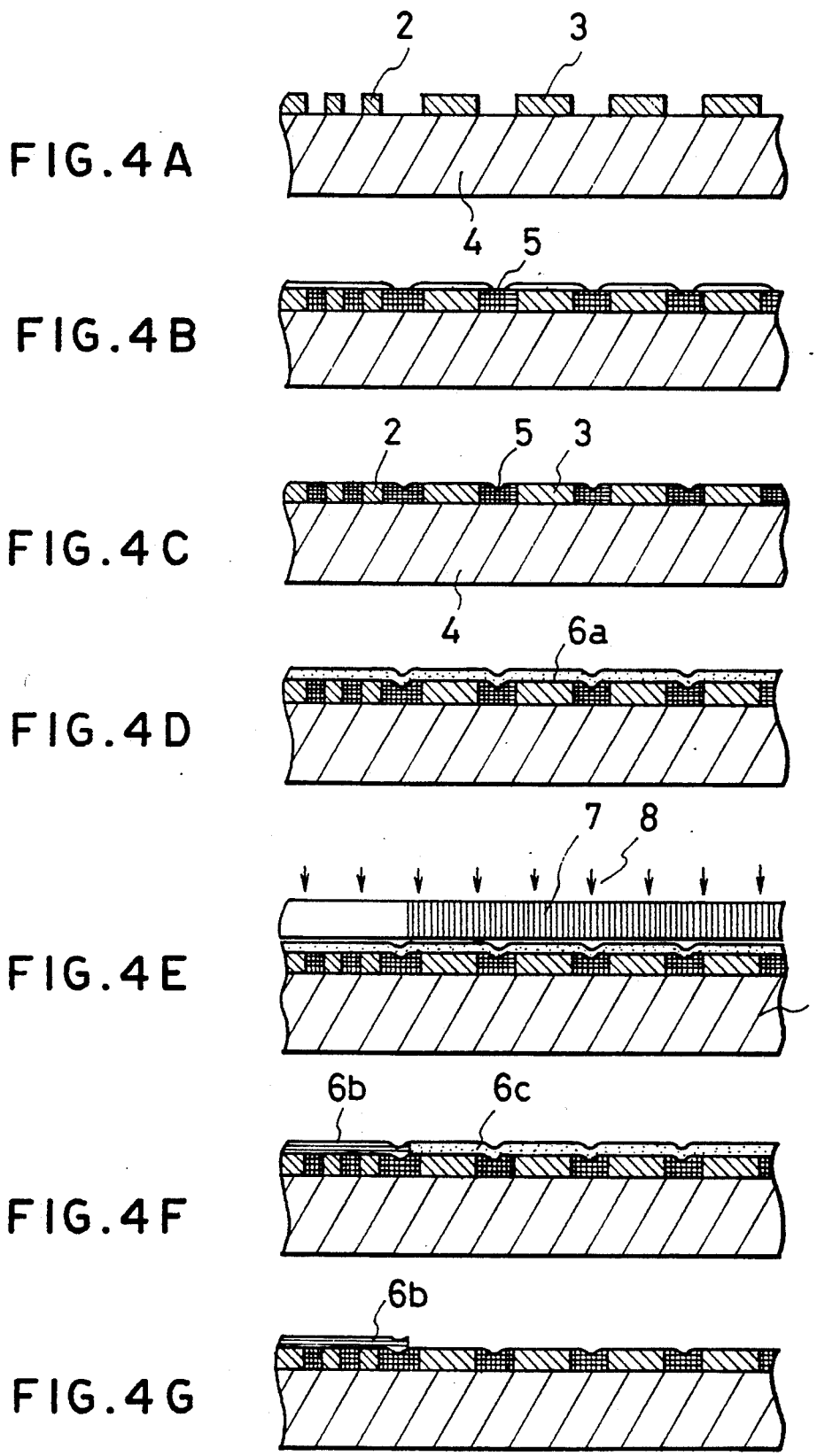

METHOD OF MAKING PRINTED WIRING BOARDS

BACKGROUND OF THE INVENTION

1. Field of the Invention

The present invention relates to a method of making a printed wiring board and in more particular to a method of making a printed wiring board which makes use of a solder resist process.

2. Description of the Prior Art

A solder resist has been used for preventing the solder bridging of a printed wiring board. Moreover, since in making a high density printed wiring board used for mounting, thereon, surface mount devices in fine pitches, the use of a method exhibiting highly precise positioning and accurate image-forming ability is required, photolithography using a light-sensitive liquid solder resist has been used for making such a high density printed wiring board instead of the screen printing method.

A method for making a printed wiring board through the conventional photolithographic method will be explained below with reference to FIG. 1 which is a perspective view of a conventional printed wiring board produced in accordance with such a photolithographic method.

As has been shown in FIG. 1, a solder resist layer 1 is formed on a high density printed wiring board used for mounting, thereon, surface mount devices in fine pitches of 0.5 mm. The solder resist 1 is formed so as to cover circuits 2 for junction formed on the wiring board and to separate the circuits 2 from pads 3 for surface-mounting likewise formed on the board, separate the circuit 2 from the adjacent circuit 2 and separate the pad 3 from the adjacent pad 3 for the purpose of preventing the bridging which may occur during soldering.

FIGS. 2A to 2E are cross sectional views showing, in order, processes for explaining the making of a printed wiring board according to the conventional photolithographic method.

First, circuits 2 for junction and pads 3 for surface-mounting are formed on a substrate to give a printed wiring board 4 provided with circuit as shown in FIG. 2A.

Then a light-sensitive liquid solder resist is applied on the whole surface of the circuit-carrying printed wiring board 4 by the curtain flow coating method and dried in a circulating hot air oven maintained at 70° to 100° C. for 20 to 40 minutes to give a film 6a of the light-sensitive liquid solder resist as shown in FIG. 2B.

Thereafter, a mask film 7 carrying a desired pattern is put on the top of the solder resist film 6a while correctly positioning it with respect to the circuit-carrying printed wiring board 4 and exposed to ultraviolet rays 8 of 200 to 1000 mj/cm² to selectively cure the solder resist film 6a as shown in FIG. 2C. At this stage, the light-sensitive liquid solder resist film 6a is selectively cured through the irradiation with the ultraviolet rays 8 to give a cured light-sensitive liquid solder resist film 6b, while the un-exposed area 6c of the light-sensitive liquid solder resist film 6a remains uncured (see FIG. 2D).

The uncured light-sensitive liquid solder resist film 6c is removed by dissolving with a developer such as a 1% sodium carbonate solution so as to leave only the cured light-sensitive liquid solder resist film 6b as shown in FIG. 2E and to thus give a conventional printed wiring board as shown in FIG. 1.

This conventional method suffers from the following problems upon forming a solder resist layer between pads arranged in fine pitches for surface-mounting.

(1) The accuracy of the positioning of a mask film relative to a circuit-carrying printed wiring board is at highest ±75 μm. Therefore, if a solder resist layer is formed between pads for surface-mounting arranged in very fine pitches of the order of not more than 0.5 mm, the solder resist suffers discrepancy of position relative to the circuit-carrying printed wiring board and in the worst case, the solder resist film covers even a part of the surface of the pads for surface-mounting. This accordingly leads to substantial reduction of reliability of the soldering between surface mount device and the printed wiring board.

(2) Since the width of the solder resist present between the pads for surface-mounting is very small, sufficient adhesion is not ensured between the solder resist and the circuit-carrying printed wiring board and this often leads to peeling off or delaminating of the solder resist film. As a result, a solder bridging is possibly formed between the adjacent pad for surface-mounting and a surface-mounted device.

SUMMARY OF THE INVENTION

Accordingly, an object of the present invention is to provide a method of making a printed wiring board in which a solder resist process is employed and more specifically to a method of making a printed wiring board which is never accompanined by any discrepancy of position of a solder resist film relative to the wiring and pad patterns formed on the printed wiring board and peeling off or delaminating of the solder resist film from the wiring board and which can provides high reliability of the soldering.

Other objects, features and advantages of the present invention will become more apparent from the following description.

According to the present invention, the foregoing object can effectively be accomplished by providing a method of making a printed wiring board which comprises the steps of applying a solder resist onto a printed wiring board on which circuits for juction and pads for surface-mounting are formed, to form a solder resist layer; grinding the surface of the solder resist layer to remove the solder resist on the circuits and the pads and to thus expose the surface thereof; applying a light-sensitive liquid solder resist to the surface of the printed wiring board; drying the light-sensitive solder resist layer to form a light-sensitive solder resist film; exposing the light-sensitive solder resist film to light through a desired mask film; and then dissolving the un-exposed area of the light-sensitive solder resist film with a developer to remove the same and to leave the cured solder resist film.

BRIEF DESCRIPTION OF THE DRAWINGS

The method for preparing a printed wiring board according to the present invention will hereinafter be explained in more detail with reference to the accompanying drawings, wherein

FIGS. 4A to 4G are cross sectional views showing, in order, processes for explaining the making of a printed wiring board according to the method of the present invention.

DESCRIPTION OF THE PREFERRED EMBODIMENTS

Preferred embodiments of the method according to the present invention will hereinafter be explained in detail with reference to the accompanying drawings.

Figure 1:
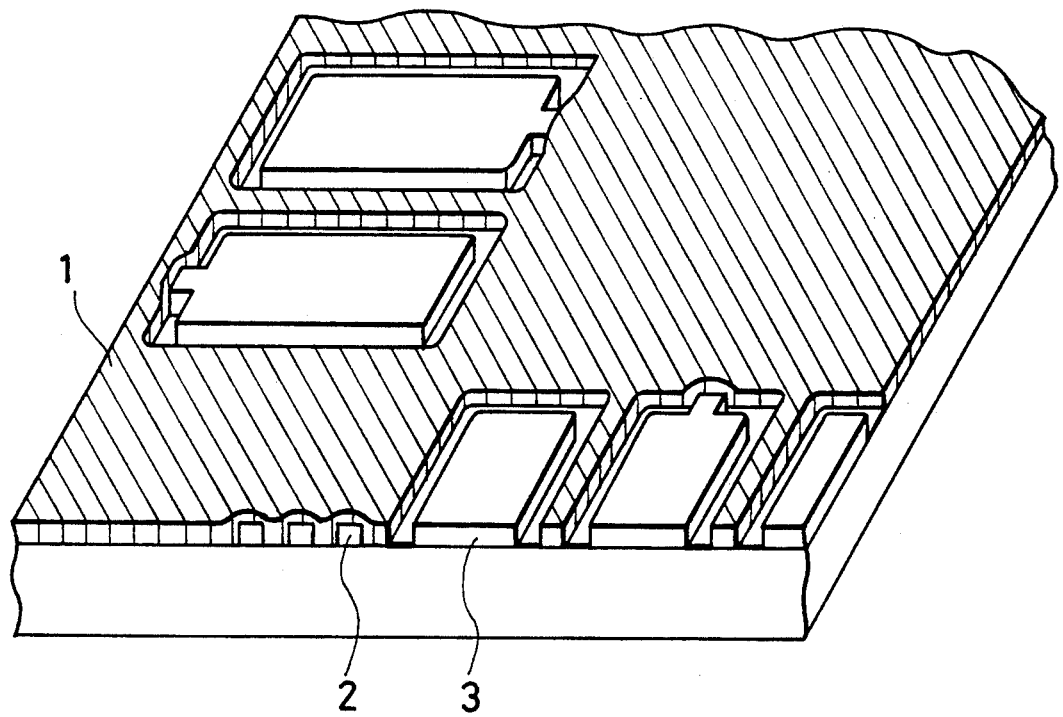
FIG. 1 is a perspective view of an embodiment of the printed wiring board made according to a conventional photolithographic method for making printed wiring boards.
Figure 2A:
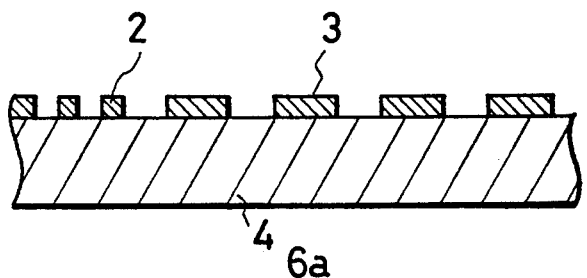
FIGS. 2A to 2E are cross sectional views showing, in order, processes for explaining the making of a printed wiring board according to the conventional photolithographic method.
Figure 2B:
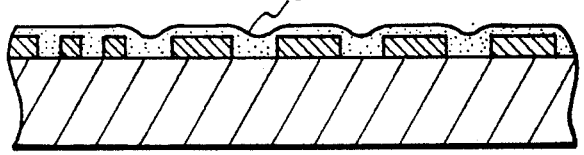
Figure 2C:
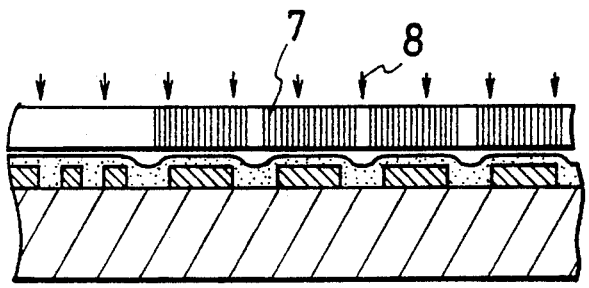
Figure 2D:
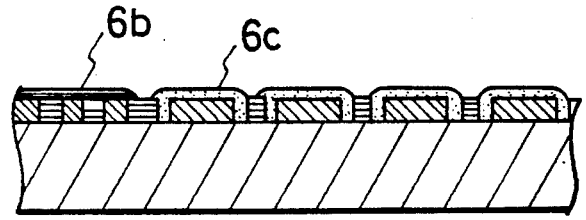
Figure 2E:
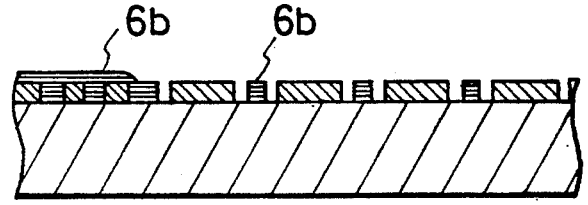
Figure 3:
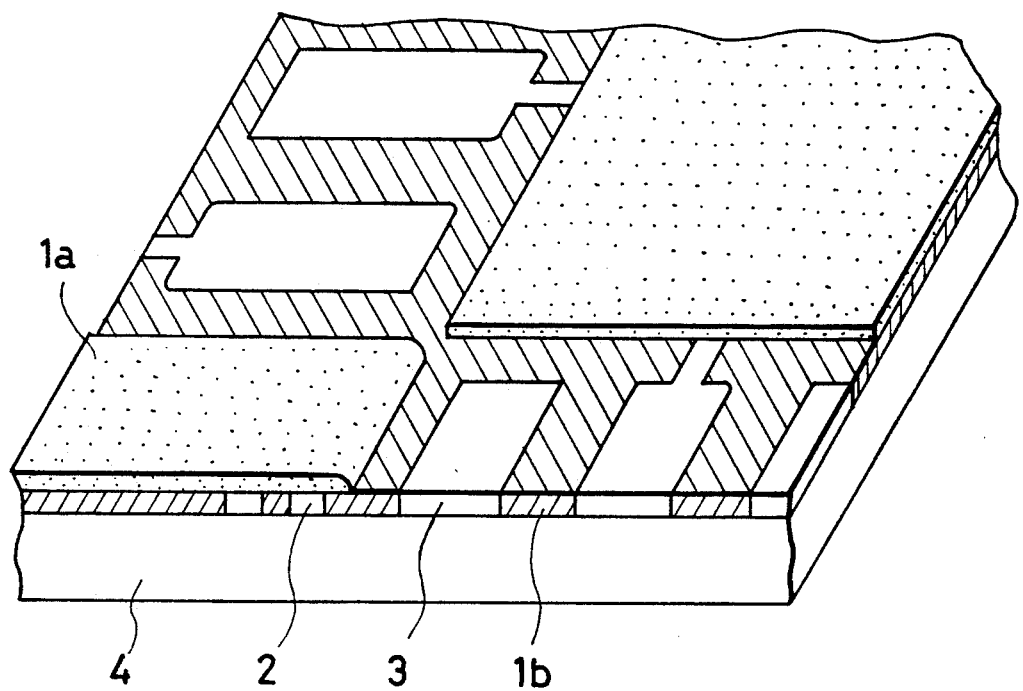
FIG. 3 is a perspective view of an embodiment of the printed wiring board made according to the method of the present invention.

Reffering to FIG. 3, there is depicted a printed wiring board made according to an embodiment of the method of the present invention. As seen from FIG. 3, a solder resist layer is formed on a high density circuit-carrying printed wiring board 4 for mounting surface mount devices in pitches of 0.5 mm so that the solder resist layer covers circuits 2 for junction (solder resist layer 1a) and fills up gaps present between pads 3 for surface-mounting, between the circuits 2 and the pads 3 and between the circuits 2 (solder resist layer 1b). The solder resist layer is thus formed for the purpose of preventing any bridging during soldering the wiring board and the surface mount device. A method for making such a printed wiring board as shown in FIG. 3 will be explained below with reference to FIGS. 4A to 4G.

The circuit-carrying printed wiring board 4 can be made by forming circuits 2 for junction and pads 3 for surface-mounting according to any method conventionally known in this art, as shown in FIG. 4A. More specifically, the circuit-carrying printed wiring board 4 can be formed, for instance, by applying a conductive film such as a Cu film onto the surface of an insulting substrate, forming a mask pattern (or an etching pattern) through a method such as the screen printing method, then etching the Cu film by a wet or dry etching process and then removing the printed mask pattern, or by applying a conductive film such as a Cu film onto an insulating substrate, applying a photoresist layer, hardening the photoresist through irradiation with light, developing it to form a mask pattern (or an etching pattern), etching the Cu film through the mask pattern and then removing the hardened light-sensitive layer. It is a matter of course that the circuit-carrying printed wiring board used in the present invention may be made according to other known methods.

Then a thermosetting solder resist is applied onto the entire surface of the circuit-carrying printed wiring board 4 through the screen printing method and then dried and set at a temperature ranging from 80° to 150° C. for 10 to 50 minutes to give a thermosetting solder resist film 5 as shown in FIG. 4B. In this respect, if an ultraviolet-curing solder resist is used, the curing process is performed by irradiating a coated film with ultraviolet rays of 1 to 10 j/cm² to cure the film.

Thereafter, the thermosetting solder resist film 5 formed on the circuits 2 for junction and the pads 3 for surface-mounting is removed by grinding the surface with an abrasive such as buff or a sand paper to thus expose the top surface of the circuits 2 for junction and the pads 3 for surface-mounting as shown in FIG. 4C.

Then a light-sensitive solder resist is applied onto the whole surface of the circuit-carrying printed wiring board 4 having exposed top surfaces of the circuits 2 for junction and the pads 3 for surface-mounting through the screen printing method and dried at 70° to 100° C. for 20 to 40 minutes in a circulating hot air oven to give a light-sensitive solder resist film 6a (see FIG. 4D).

A mask film 7 carrying a desired pattern is put on the light-sensitive solder resist film 6a formed on the circuit-carrying printed wiring board 4, followed by positioning of the mask 7 relative to the printed wiring board 4, exposure to ultraviolet rays 8 of 200 to 1000 mj/cm² to selectively cure the light-sensitive solder resist 6a on the circuits 2 for junction and to thus form a selectively cured light-sensitive solder resist film 6b as shown in FIG. 4E. At this stage, the light-sensitive solder resist film 6a exposed to the ultraviolet rays 8 is selectively cured to give a cured solder resist film portion 6b while a portion 6c of the light-sensitive solder resist free of exposure to the ultraviolet rays 8 still remains uncured (see FIG. 4F).

Finally, the uncured light-sensitive solder resist film portion 6c is removed by dissolving it with a developer such as a 1% sodium carbonate solution as shown in FIG. 4G to give a completed printed wiring board of the present invention as shown in FIG. 3.

In the foregoing step shown in FIG. 4C, after the removal of the thermosetting solder resist film 5, the surface of the circuit-carrying printed wiring board 4 may be soft-etched for the cleaning of the top surfaces of the circuits 2 for junction and the pads 3 for surface-mounting. Further, in the step shown in FIG. 4D, the light-sensitive solder resist can likewise be applied onto the surface of the circuit-carrying printed wiring board 4 through the screen printing method while utilizing a screen carrying a desired pattern as a mask. In this case, the exposure process shown in FIG. 4E can very easily be carried out since the entire surface can be exposed to ultraviolet rays without using any mask and further the development process shown in FIG. 4G can be eliminated.

In the method for making a circuit-carrying printed wiring board according to the present invention, the circuits for junction formed on the printed wiring board are covered with a solder resist layer and the solder resist also fills up gaps formed between the pads for surface-mounting, between the pads and the circuits for junction and between the circuits, as has been explained above in detail. For this reason, the following effects can be accomplished by the method of the present invention.

(1) Since the method does not require the positioning of a mask film relative to a circuit-carrying printed wiring board, gaps present between pads for surface-mounting can be filled up with a solder resist layer without covering a part of the surface of the pad for surface-mounting with the solder resist and, therefore, high reliability of soldering can be ensured between devices to be surface-mounted and the printed wiring board.

(2) The gaps between the pads for surface-mounting are filled up with the solder resist and the solder resist has high adhesion to the circuit-carrying printed wiring board. Therefore, the resulting solder resist layer thus formed would not be peeled off or delaminated due to insufficient adhesion to the printed wiring board and thus any solder bridging can certainly be prevented during soldering.

What is claimed is:

1. A method for making a printed wiring board comprising the steps of applying a solder resist onto a printed wiring board on which circuits for junction and pads for surface-mounting are formed, to form a solder resist layer; grinding the surface of said solder resist layer to remove the solder resist present on said circuits and said pads and to expose the surface thereof; applying a light-sensitive solder resist to the surface of said printed wiring board to form a light-sensitive solder resist layer, drying said light-sensitive solder resist layer to form a light-sensitive solder resist film; exposing said light-sensitive solder resist film to light through a mask film carrying a desired pattern; and then dissolving the un-exposed area of said light-sensitive solder resist film with a developer to remove the same area and to cover the exposed area with the cured solder resist film.

2. The method of claim 1 wherein said solder resist layer is a thermosetting solder resist layer.

3. The method of claim 2 wherein said solder resist layer is formed by applying the thermosetting solder resist onto the entire surface of a printed wiring board on which circuits for junction and pads for surface-mounting are formed through a screen printing method and then drying and curing the applied solder resist at a temperature ranging from 80° to 150° C. for 10 to 50 minutes.

4. The method of claim 1 wherein said solder resist is an ultraviolet-curing solder resist.

5. The method of claim 4 wherein the curing of said ultraviolet-curing solder resist is performed by irradiating a coated layer with ultraviolet rays of 1 to 10 j/cm$^2$.

6. The method of claim 1 wherein said grinding is performed using a buff or sand paper as an abrasive.

7. The method of claim 1 wherein said light-sensitive solder resist film is formed by applying a light-sensitive liquid solder resist onto the whole surface of the circuit-carrying printed wiring board having exposed top surface of the circuits for junction and the pads for surface-mounting through a screen printing method and drying the coated layer at a temperature ranging from 70° to 100° C. for 20 to 40 minutes.

8. The method of claim 1 wherein said cured light-sensitive solder resist film is formed by putting said mask film carrying a desired pattern on said light-sensitive solder resist film formed on said circuit-carrying printed wiring board, followed by positioning, exposure to ultraviolet rays of 200 to 1000 mj/cm$^2$ to selectively cure said light-sensitive solder resist film on said circuits for junction and to thus form a selectively cured light-sensitive solder resist film.

9. The method of claim 1 wherein said developer is a sodium carbonate solution.

10. The method of claim 1 wherein it further comprises the step of etching the surface of said circuit-carrying printed wiring board after the removal of said solder resist layer to clean the surface of said circuits for junction and said pads for surface-mounting.

11. The method of claim 1 wherein said light-sensitive solder resist is applied onto the surface of said circuit-carrying printed wiring board through a screen printing method while utilizing a screen carrying a desired pattern as a mask.

12. A method for making a printed wiring board comprising the steps of applying a thermosetting solder resist onto the entire surface of a printed wiring board on which circuits for junction and pads for surface-mounting are formed, through a screen printing method and then drying and setting at a temperature ranging from 80° to 150° C. for 10 to 50 minutes to give a thermosetting solder resist film; removing said thermosetting solder resist film formed on said circuits for junction and said pads for surface-mounting by grinding the surface with a buff or sand paper to expose the top surface of said circuits and pads; then applying a light-sensitive liquid solder resist onto the whole surface of the circuit-carrying printed wiring board having exposed top surfaces of said circuits and pads through a screen printing method and drying at 70° to 100° C. for 20 to 40 minutes in a circulating hot air oven to give a light-sensitive solder resist film; putting a mask film carrying a desired pattern on said light-sensitive solder resist film formed on said circuit-carrying printed wiring board, positioning said mask film relative to said printed wiring board, exposing to ultraviolet rays of 200 to 1000 mj/cm$^2$ to selectively cure said light-sensitive solder resist film on said circuits and to thus form a selectively cured light-sensitive solder resist film; removing the uncured light-sensitive solder resist film portion by dissolving it with a developer.

13. The method of claim 12 wherein an ultraviolet-curing solder resist is used instead of said thermosetting solder resist and the curing step is performed by irradiating a coated film with ultraviolet rays of 1 to 10 jm/cm$^2$.

* * * * *